United States Patent
Cheng et al.

(10) Patent No.: US 6,703,317 B1
(45) Date of Patent: Mar. 9, 2004

(54) METHOD TO NEUTRALIZE CHARGE IMBALANCE FOLLOWING A WAFER CLEANING PROCESS

(75) Inventors: Yi-Lung Cheng, Taipei (TW); Ming-Hwa Yoo, Shin-Chu (TW); Sze-An Wu, Hsin-Chu (TW); Ying-Lung Wang, Tai-Chung (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/356,248

(22) Filed: Jan. 30, 2003

(51) Int. Cl.[7] .................. H01L 21/302; H01L 21/461
(52) U.S. Cl. .................. 438/716; 438/710; 438/719; 438/723; 438/906
(58) Field of Search ................. 438/723, 656, 438/690, 719, 691, 692, 906, 710, 475, 716

(56) References Cited

U.S. PATENT DOCUMENTS

| | | | | |
|---|---|---|---|---|
| 5,039,349 A | * | 8/1991 | Schoeppel | 134/26 |
| 5,421,902 A | * | 6/1995 | Odajima et al. | 134/19 |
| 5,723,383 A | * | 3/1998 | Kosugi et al. | 438/719 |
| 5,795,401 A | * | 8/1998 | Itoh et al. | 134/6 |
| 5,811,358 A | * | 9/1998 | Tseng et al. | 438/725 |
| 5,834,371 A | * | 11/1998 | Ameen et al. | 438/656 |
| 5,968,279 A | * | 10/1999 | MacLeish et al. | 134/1.2 |
| 5,996,594 A | * | 12/1999 | Roy et al. | 134/1.3 |
| 6,007,675 A | * | 12/1999 | Toshima | 156/345.32 |
| 6,058,945 A | * | 5/2000 | Fujiyama et al. | 134/1.3 |
| 6,079,426 A | * | 6/2000 | Subrahmanyam et al. | 134/1.1 |
| 6,090,217 A | * | 7/2000 | Kittle | 134/11 |
| 6,204,192 B1 | * | 3/2001 | Zhao et al. | 438/723 |
| 6,221,774 B1 | * | 4/2001 | Malik | 438/690 |
| 6,358,325 B1 | * | 3/2002 | Andreas | 134/2 |
| 6,432,479 B2 | * | 8/2002 | Chang et al. | 427/255.394 |
| 6,613,242 B2 | * | 9/2003 | Nakahara et al. | 216/63 |

* cited by examiner

Primary Examiner—Michael S. Lebentritt
(74) Attorney, Agent, or Firm—Tung & Associates

(57) ABSTRACT

A method of reducing an electrical charge imbalance on a wafer process surface including providing a semiconductor wafer having a process surface including an upper most first material layer; cleaning the process surface according to a wafer cleaning process including at least one of spraying and scrubbing to produce an electrical charge imbalance at the process surface; and, subjecting the process surface to a nitrogen containing plasma treatment to at least partially neutralize the electrical charge imbalance.

20 Claims, 1 Drawing Sheet

METHOD TO NEUTRALIZE CHARGE IMBALANCE FOLLOWING A WAFER CLEANING PROCESS

FIELD OF THE INVENTION

This invention generally relates to semiconductor wafer manufacturing and more particularly to a method for reducing electrical charge imbalances produced by an electrical charge producing wafer cleaning process.

BACKGROUND OF THE INVENTION

In creating a multiple layer semiconductor device on a semiconductor wafer, each layer making up the device may be subjected to one or more deposition processes, for example using chemical vapor deposition (CVD) or physical vapor deposition (PVD), and usually including one or more etching procedures by either a dry (plasma) or wet (chemical) etching process. A critical condition in semiconductor manufacturing is the absence of contaminants on the wafer processing surface, since contaminants including, for example, microscopic particles, may interfere with and adversely affect subsequent processing steps leading to device degradation and ultimately semiconductor wafer rejection.

While the wafer cleaning process has been always been a critical step in the semiconductor wafer manufacturing process, ultraclean wafers are becoming even more critical to device integrity. For example, as semiconductor feature sizes decrease, the detrimental affect of particle contamination increases, requiring removal of ever smaller particles. For example, particles as small as 5 nm may be unacceptable in many semiconductor manufacturing processes. Further, as the number of device layers increase, for example to 5 to 8 layers, there is a corresponding increase in the number of cleaning steps and the potential for device degradation caused by particulate contamination. To adequately meet requirements for ultraclean wafers in ULSI and VLSI the wafer surface must be essentially free of contaminating particles.

For example, insulating dielectric layers also referred to as inter-metal dielectric (IMD) layers are typically deposited by plasma enhanced CVD (PECVD) or high density plasma CVD (HDP-CVD). In these deposition processes a degree of sputtering occurs as the layer of material is deposited causing a higher degree of particulate contamination as the deposition time increases. In addition, PVD processes are typically used to deposit films of metal, for example barrier/adhesion layers within anisotropically etched features or for metal filling an anisotropically etched feature. PVD processes tend to coat the inner surfaces of the processing chamber with a metal film, flaking off to contaminate a wafer process surface as the metal film increases in thickness and are subjected to cyclic thermal stresses. The degree of particulate contamination depositing on the process surface increases with the thickness of the film being deposited.

To overcome the problem of particulate contamination which can lead to "killer defects" wafer process surface cleaning processes increasingly use a combination of spraying with a high pressure cleaning solution and scrubbing the wafer surface with a rotating brush including specialized bristles to avoid scratching the wafer process surface.

One increasingly critical problem with several semiconductor wafer manufacturing processes is the tendency of the process to produce electrical charge imbalances at the wafer surface. The presence of electrical charge imbalances may lead to a variety of problems in subsequent processes. Increasingly important in wafer process technologies as device sizes shrink is the effect of electrical charge imbalance produced at the wafer surface which has not been adequately addressed by prior art processes. Electrical charge imbalances at the wafer surface may lead to subsequent processing difficulties, for example in plasma enhanced deposition processes where the presence of electrical charge imbalances may affect the plasma process leading to a reduced wafer yield.

There is therefore a need in the semiconductor processing art to develop a method whereby an electrical charge imbalance at a semiconductor wafer process surface is avoided following a particulate cleaning process to improve a subsequent processing step including a wafer manufacturing yield.

It is therefore an object of the invention to provide a method whereby an electrical charge imbalance at a semiconductor wafer process surface is avoided following a particulate cleaning process to improve a subsequent processing step including a wafer manufacturing yield, while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method of reducing an electrical charge imbalance on a wafer process surface.

In a first embodiment, the method includes providing a semiconductor wafer having a process surface including an upper most first material layer; cleaning the process surface according to a wafer cleaning process including at least one of spraying and scrubbing to produce an electrical charge imbalance at the process surface; and, subjecting the process surface to a nitrogen containing plasma treatment to at least partially neutralize the electrical charge imbalance.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained by reference to an exemplary semiconductor manufacturing process, it will be appreciated that the method of the present invention is applicable to any semiconductor manufacturing process, including damascene formation processes where an electrical charge imbalance may be advantageously avoided in a dielectric insulating layer following an electrical charge imbalance producing process to improve a subsequent deposition process including promoting adhesion of a subsequently deposited material layer.

In a first embodiment of the invention, a semiconductor wafer process surface is provided comprising a first material layer deposited in an immediately preceding manufacturing process and including particulate contamination. A wafer cleaning process comprising at least one a pressurized cleaning solution spray and a brush cleaning process is carried out to produce an electrical charge imbalance at the wafer process surface. A charge neutralizing plasma treatment including a nitrogen containing plasma is carried out to at least partially neutralize the electrical charge imbalance followed by a plasma enhanced CVD deposition of a second material layer over the first material layer. The process of wafer cleaning, charge neutralization plasma treatment, and material layer deposition may be optionally repeated in a multi-step deposition process to deposit the second material layer.

In one embodiment, the first material layer is a dielectric insulating layer is formed of at least one of silicon dioxide, carbon doped oxide (C-oxide), organo-silicate glass (OSG), undoped silicate glass (USG), and fluorinated silicate glass (FSG). The first material layer is preferably deposited by at a CVD. The CVD process includes, for example, plasma enhanced CVD (PECVD), and high-density plasma CVD (HDP-CVD)

In another embodiment, the second material layer includes at least one of a dielectric insulating layer having the same preferred embodiments as the first material layer and a metal nitride containing layer. For example the metal nitride layer is an etching stop layer including nitrides of silicon, for example silicon nitride or silicon oxynitride, or a barrier layer, including nitrides of refractory metals, for example titanium (e.g., TiN), tungsten (e.g., WN), and tantalum(e.g., TaN). For example, the barrier layer may optionally include a first refractory metal portion, followed by nitridization to form metal nitride upper portion of the barrier layer.

Figure 1:
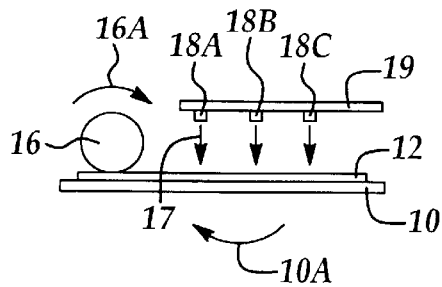
FIG. 1 is a cross section side view of an exemplary scrubber cleaning process used according to an embodiment of the present invention.

In another embodiment, the wafer cleaning process includes at least one of a pressurized spraying and scrubbing process, for example including a high pressure jet of cleaning fluid sprayed on the wafer surface with simultaneous mechanical scrubbing. For example referring to FIG. 1 is shown a portion of exemplary wafer cleaning process showing a wafer 12 mounted on a rotatable platen 10 for spinning the wafer while simultaneously rotating brush 16 in contact with process surface 12B of the wafer 12 as indicated by directional arrows 10A and 16A respectively. During the mechanical brushing process, a cleaning liquid, for example deionized water, is sprayed by pressurized nozzles (jets), e.g., 18A, 18B and 18C, on the wafer surface as indicated by directional arrows e.g., 17, the pressurized nozzles disposed in a sprayer arm 19 disposed above the wafer process surface 12B. It will be appreciated that any mechanical brushing (scrubbing) process and/or pressurized spraying process, preferably both mechanical brushing and pressurized spraying, including simultaneously spraying and/or brushing both a process side and backside of a wafer, may be used in the wafer cleaning process according to an embodiment of the present invention as long as an electrical charge imbalance, for example an excess negative charge, is produced on the wafer process surface. Preferably, the scrubber is equipped with a brush that will not damage the wafer process surface such as a plastic material including, for example, a porous polyvinyl acetyl (PVA).

The cleaning solution may be any cleaning solution but preferably includes at least one of hydrogen peroxide $H_2O_2$), sulfuric acid ($H_2SO_4$), choline (($CH_3$)$_3$ N($CH_2CH_2OH$)OH), ammonium hydroxide ($NH_4OH$), hydrochloric acid, (HCl), a carboxylic group containing acid, such as citric acid, and deionized water.

It has been found according to the present invention that the action of either mechanical brushing the process wafer surface or spraying the process wafer surface with a pressurized spray source, for example deionized water, leads to a buildup of excess negative electrical charge on the process wafer surface with both processes resulting in a greater charge accumulation. For example, it has been found that a wafer process surface including a PECVD or HDP-CVD deposited IMD layer of fluorinated silicate glass (FSG) that a significant excess negative charge imbalance is produced on the wafer process surface, for example, producing an excess negative charge producing a surface Voltage of about −30 Volts following a wafer scrubbing/spraying wafer cleaning process compared to about a 0.5 surface Voltage following a conventional dipping wafer cleaning process. It has been found that the excess negative electrical charge present on the FSG layer produces several deleterious effects in a subsequent plasma enhanced CVD deposition process. For example it has been found that the adhesion of a subsequently deposited material layer, for example another FSG IMD layer, a silicon nitride etching stop layer, or a barrier layer, has significantly reduced adhesion. Further, it has been found where the subsequently deposited material layer is relatively thinner such as an etching stop layer or a barrier layer that the incidence of pinholes is increased leading to undesired leakage currents and potential electromigration failure. While the precise reason an excess negative charge on the wafer surface adversely affects a subsequent plasma enhanced CVD deposition process is unknown, it is believed that nucleation and growth of the subsequent layer in a CVD deposition process is inhibited thereby causing pinholes and a reduced level of chemisorption at the charged wafer surface resulting in lower adhesion of the deposited layer.

According to an embodiment of the present invention, following the electrical charge imbalance wafer cleaning process, the process wafer is subjected to a charge neutralizing plasma treatment process. Preferably, the charge neutralizing plasma treatment process includes a nitrogen containing plasma. Preferably, the nitrogen containing plasma is formed by supplying a source gas of at least one of $N_2$, $N_2O$, $NH_3$, and NO. Preferably, the plasma is produced by supplying source gases to form a mixture of at least $N_2$ and $NH_3$ to form the nitrogen containing plasma. The plasma may be formed by any conventional plasma producing reactor, for example a PECVD reactor or an HDP-CVD reactor, for example having an ICP RF power source. The plasma reactor for carrying out the charge neutralizing plasma treatment may be the same or different from plasma reactor for carrying out a subsequent CVD deposition, but preferably is the same plasma reactor to increase a wafer throughput and reduce a process cycle time.

For example in an exemplary charge neutralizing plasma treatment, at least one of $N_2$ and $N_2O$ is provided at a flow rate of about 1000 to about 2000 sccm, and $NH_3$ is provided at a flow rate of about 30 to about 500 sccm at a total plasma operating pressure of about 5 mTorr to about 100 mTorr. The RF power is provided at about 300 Watts to about 500 Watts to form a nitrogen containing plasma with the plasma treatment lasting from about 15 seconds to about 60 seconds.

Optionally, an RF bias of about 25 Watts to about 75 Watts may be provided to the process wafer to shorten the plasma treatment time.

Figure 2A:
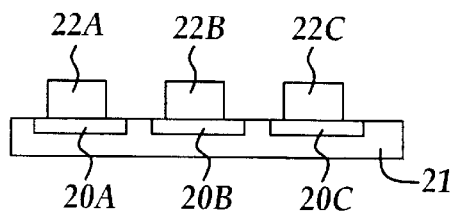
FIGS. 2A–2C are representative cross sectional side views of a portion of a semiconductor wafer at stages in an exemplary semiconductor feature manufacturing process according to an embodiment of the present invention.
Figure 2B:
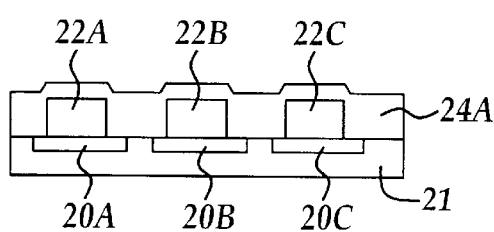
Figure 2C:
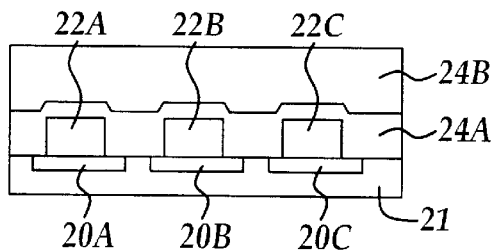

Referring to FIG. 2A, in an exemplary embodiment, a metallization layer having anisotropically etched metal conductive areas, e.g., 22A, 22B, and 22C formed by a plasma metal etching process over an insulating dielectric layer 21 including damascene metal plugs e.g., 20A, 20B, 20C. Referring to FIG. 2B a first gap filling oxide (e.g., FSG) layer 24A is deposited to fill the gaps between the metal conductive areas, for example by an HDP-CVD process. Following the HDP-CVD oxide gap fill process, the semiconductor wafer is subjected to a wafer cleaning process to remove particulates according to preferred embodiments. Referring to FIG. 2C, following the wafer cleaning process but prior to depositing second oxide (e.g., FSG) layer 24B according to a PECVD process, the neutralizing plasma treatment according to preferred embodiments is carried out on wafer process surface to at least partially neutralize an excess electrical charge produced by the wafer cleaning process. Following deposition of the PECVD oxide, a CMP planarization process is carried out to planarize the process surface in preparation of a photolithographic patterning and etching process to etch, for example, vias through a thickness of the PECVD oxide layer and HDP-CVD oxide layer to communicate with metal conductive areas e.g., 22A, 22B, and 22C. It will be appreciated that the charge neutralizing plasma treatment process may be carried out following and prior to PECVD deposition of IMD layers in the formation of metal damascenes, for example copper filled damascenes.

Figure 3:
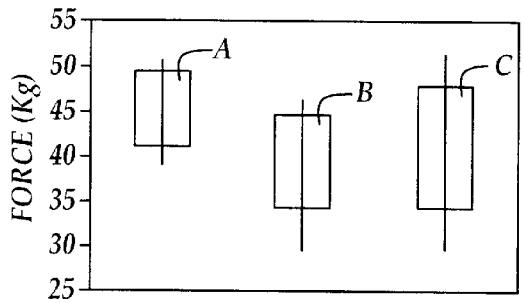
FIG. 3 is a representation of data showing the improvement in adhesion of a subsequently deposited material layer following the charge neutralizing plasma treatment according to an embodiment of the present invention.

Referring to FIG. 3, are shown three enclosed areas A, B, and C enclosing a standard deviation of a force value, represented on the vertical axis, applied in a conventional layer adhesion strength test required to cause at least partial delamination of a PECVD deposited FSG oxide layer from an underlying HDP-CVD FSG oxide layer. Enclosed area C represents a relative adhesion force of an overlying PECVD FSG oxide layer in a process whereby the underlying HDP-CVD FSG oxide layer has not undergone an electrical charge imbalance producing wafer cleaning process, for example a scrubbing process, nor a charge neutralizing plasma treatment process prior to deposition of the PECVD FSG oxide layer. Enclosed area B represents a relative adhesion force value whereby the HDP-CVD FSG oxide layer has undergone an electrical charge imbalance producing wafer cleaning process, for example a scrubbing process, but has not undergone a charge neutralizing plasma treatment process prior to deposition of the PECVD FSG oxide layer. Enclosed area A represents a relative adhesion force value whereby the HDP-CVD FSG oxide layer has undergone an electrical charge imbalance producing wafer cleaning process, for example a scrubbing process, and has also undergone a charge neutralizing plasma treatment process according to preferred embodiments prior to deposition of the PECVD FSG oxide layer. Thus, it is clearly seen that the adhesion of the PECVD FSG layer to the underlying HDP-CVD FSG oxide layer is enhanced by a charge neutralizing plasma treatment process according to preferred embodiments carried out on the underlying HDP-CVD FSG oxide layer prior to deposition of the overlying PECVD FSG oxide layer.

Advantageously, other benefits of the charge neutralizing plasma treatment are that the dielectric constant of the treated layer, for example the HDP-CVD FSG oxide layer is not affected, especially important for a dielectric insulating layer. In addition, the deposition of the overlying PECVD layer has improved properties including a film deposition uniformity resulting in an improved yield in parallel capacitance wafer acceptance testing.

Figure 4:
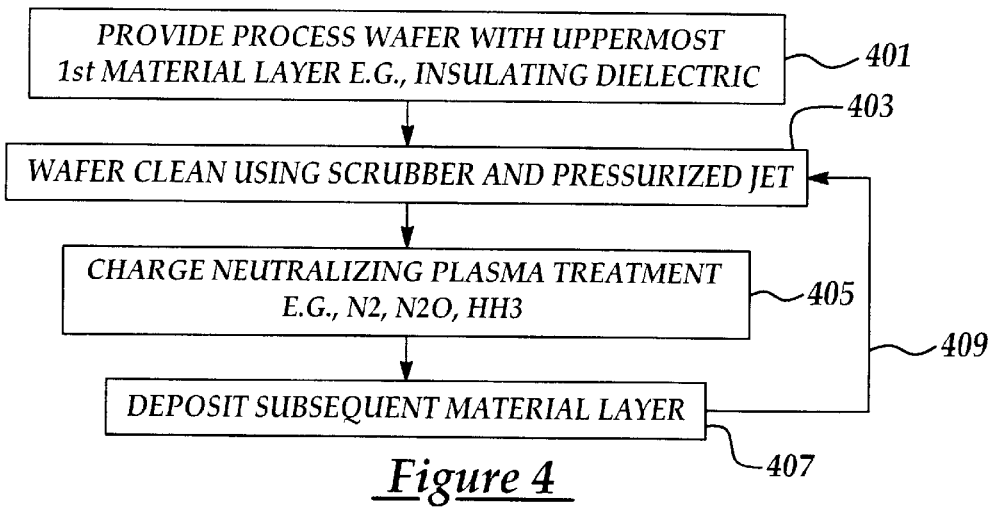
FIG. 4 is a process flow diagram including several embodiments of the present invention.

Referring to FIG. 4 is a process flow diagram including several embodiments of the present invention. In process 401 a process wafer is provided having an upper most first material layer, for example a dielectric insulating layer deposited according to a plasma enhanced CVD deposition process. In process 403 an electrical charge imbalance producing wafer cleaning process, for example including a scrubbing and pressurized jet (nozzle) spraying process is carried out according to preferred embodiments. In process 405, an electrical charge neutralizing plasma treatment according to preferred embodiments is carried out. In process 407, a subsequent material layer is deposited over the first material layer according to a plasma enhanced CVD process. As indicated by process directional arrow 409, the processes 403 through 407 may optionally be repeated in a multi-layer deposition process following an electrical charge imbalance producing wafer cleaning process carried out prior to a subsequent material layer deposition process.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of reducing an electrical charge imbalance on a wafer process surface comprising the steps of:

providing a semiconductor wafer having a process surface comprising an upper most first material layer;

cleaning the process surface according to a wafer cleaning process comprising at least one of spraying and scrubbing to produce an electrical charge imbalance at the process surface; and, subjecting the process surface to a nitrogen containing plasma treatment to at least partially neutralize the electrical charge imbalance.

2. The method of claim 1, further comprising the step of depositing a second material layer over the first material layer according to a plasma enhanced CVD deposition process.

3. The method of claim 2, wherein the first and second material layer is a dielectric insulating layer.

4. The method of claim 2, wherein at least one of the first and second material layers are selected from the group consisting of fluorinated silicate glass (FSG), carbon doped oxide, organo silicate glass (OSG), and undoped silicate glass (USG).

5. The method of claim 4, wherein the first and the second material layers comprise FSG.

6. The method of claim 2, wherein the second material layer comprises a layer selected from the group consisting of silicon nitride, silicon oxynitride, titanium nitride, tantalum nitride, and tungsten nitride.

7. The method of claim 1, wherein the nitrogen containing plasma treatment comprises a plasma gas source selected from the group consisting of nitrogen ($N_2$), nitrous oxide ($N_2O$), and ammonia ($NH_3$).

8. The method of claim 7, wherein the nitrogen containing plasma treatment comprises a pressure of about 10 mTorr to about 100 mTorr and an RF power of about 300 to about 500 Watts.

9. The method of claim 1, wherein the nitrogen containing plasma treatment comprises a plasma gas source consisting essentially of nitrogen ($N_2$) and ammonia ($NH_3$).

10. The method of claim 2, wherein the steps of cleaning, subjecting and depositing are sequentially repeated.

11. The method of claim 1, wherein the wafer cleaning process spraying process comprises a pressurized spray source simultaneously sprayed onto the process surface while rotating the semiconductor wafer and contacting the process surface with a brush.

12. A method of improving the adhesion of a plasma enhanced CVD deposited layer comprising the steps of:

provi ding a semiconductor wafer having a process surface comprising an upper most first material layer;

cleaning the process surface according to a wafer cleaning process comprising at least one of spraying and scrubbing to produce an electrical charge imbalance at the process surface;

subjecting the process surface to a nitrogen containing plasma treatment to substantially neutralize the electrical charge imbalance; and, depositing a second material layer over the first material layer according to a plasma enhanced CVD deposition process.

13. The method of claim 12, wherein the first and second material layers are dielectric insulating layers.

14. The method of claim 12, wherein at least one of the first and second material layers are selected from the group consisting of fluorinated silicate glass (FSG), carbon doped oxide, organo silicate glass (OSG), and undoped silicate glass (USG).

15. The method of claim 14, wherein the first and the second material layers comprise FSG.

16. The method of claim 12, wherein the second material layer comprises a layer selected from the group consisting of silicon nitride, silicon oxynitride, titanium nitride, tantalum nitride, and tungsten nitride.

17. The method of claim 11, wherein the nitrogen containing plasma treatment comprises a plasma gas source selected from the group consisting of nitrogen ($N_2$), nitrous oxide ($N_2O$), and ammonia ($NH_3$).

18. The method of claim 7, wherein the nitrogen containing plasma treatment comprises a pressure of about 10 mTorr to about 100 mTorr and an RF power of about 300 to about 500 Watts.

19. The method of claim 2, wherein the steps of cleaning, subjecting and depositing are sequentially repeated.

20. The method of claim 1, wherein the wafer cleaning process spraying process comprises a pressurized spray source simultaneously sprayed onto the process surface while rotating the semiconductor wafer and contacting the process surface with a brush.

* * * * *